United States Patent
Ishigaki et al.

(10) Patent No.: US 12,162,079 B2
(45) Date of Patent: Dec. 10, 2024

(54) SURFACE-COATED CUTTING TOOL

(71) Applicant: MITSUBISHI MATERIALS CORPORATION, Tokyo (JP)

(72) Inventors: Takuya Ishigaki, Joso (JP); Kousuke Yanagisawa, Naka (JP); Hiroki Nakamura, Joso (JP); Hisashi Honma, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 776 days.

(21) Appl. No.: 17/417,631

(22) PCT Filed: Dec. 26, 2019

(86) PCT No.: PCT/JP2019/051161
§ 371 (c)(1),
(2) Date: Jun. 23, 2021

(87) PCT Pub. No.: WO2020/138304
PCT Pub. Date: Jul. 2, 2020

(65) Prior Publication Data
US 2022/0111446 A1    Apr. 14, 2022

(30) Foreign Application Priority Data

Dec. 27, 2018 (JP) ................... 2018-243963
Dec. 17, 2019 (JP) ................... 2019-227056

(51) Int. Cl.
*B23B 27/14* (2006.01)
*C23C 16/36* (2006.01)
*C23C 30/00* (2006.01)

(52) U.S. Cl.
CPC ........ *B23B 27/148* (2013.01); *B23B 2228/10* (2013.01); *C23C 16/36* (2013.01); *C23C 30/005* (2013.01)

(58) Field of Classification Search
None
See application file for complete search history.

(56) References Cited

U.S. PATENT DOCUMENTS

2010/0233511 A1    9/2010  Endler et al.
2010/0323176 A1   12/2010  Van den Berg et al.
(Continued)

FOREIGN PATENT DOCUMENTS

CN    104884199 A    9/2015
CN    105247099 A    1/2016
(Continued)

OTHER PUBLICATIONS

International Search Report mailed Mar. 24, 2020 for the corresponding PCT International Patent Application No. PCT/JP2019/051161.
(Continued)

*Primary Examiner* — Seth Dumbris
(74) *Attorney, Agent, or Firm* — Leason Ellis LLP; Melvin C. Garner; Mitsuhiro Haraguchi

(57) ABSTRACT

A surface-coated cutting tool includes a tool body and a hard coating layer, where one TiAlCN layer α (1) containing 70 area % or more of a wurtzite type hexagonal structure on a tool surface side (S) and one TiAlCN layer β (2) containing 70 area % or more of a NaCl type face-centered cubic structure on the tool body side (B), when a composition of the TiAlCN layer α (1) is represented by $(Ti_{(1-x\alpha)}Al_{x\alpha})(C_{y\alpha}N_{(1-y\alpha)})$ satisfying $0.70 \le x\alpha \le 0.95$ and $0.000 \le y\alpha \le 0.010$, when a composition of the TiAlCN layer β (2) is represented by $(Ti_{(1-x\beta)}Al_{x\beta})(C_{y\beta}N_{(1-y\beta)})$ satisfying $0.65 \le x\beta \le 0.95$ and $0.000 \le y\beta \le 0.010$, and when average layer thicknesses of the TiAlCN layer α (1) and the TiAlCN layer β (2) are defined as Lα and Lβ satisfying $0.5\ \mu m \le L\alpha \le 10.0\ \mu m$ and $1.0\ \mu m \le L\beta \le 20.0\ \mu m$.

5 Claims, 1 Drawing Sheet

(56) References Cited

U.S. PATENT DOCUMENTS

| | | | | |
|---|---|---|---|---|
| 2011/0081539 | A1* | 4/2011 | Ni | C23C 14/0641 |
| | | | | 427/580 |
| 2012/0219789 | A1* | 8/2012 | Endler | C23C 16/36 |
| | | | | 428/335 |
| 2014/0193623 | A1* | 7/2014 | Setoyama | C23C 28/42 |
| | | | | 428/323 |
| 2015/0217378 | A1* | 8/2015 | Tatsuoka | C23C 28/42 |
| | | | | 428/697 |
| 2016/0040285 | A1 | 2/2016 | Tatsuoka et al. | |
| 2017/0021429 | A1* | 1/2017 | Paseuth | B23B 27/148 |
| 2018/0029144 | A1 | 2/2018 | Ono et al. | |
| 2019/0111497 | A1* | 4/2019 | Stiens | C23C 28/04 |
| 2019/0177839 | A1 | 6/2019 | Fukunaga et al. | |

FOREIGN PATENT DOCUMENTS

| | | |
|---|---|---|
| CN | 107075673 A | 8/2017 |
| CN | 107405695 A | 11/2017 |
| JP | 2001-341008 A | 12/2001 |
| JP | 2005271133 A | 10/2005 |
| JP | 2011-500964 A | 1/2011 |
| JP | 2011-516722 A | 5/2011 |
| JP | 2013-510946 A | 3/2013 |
| JP | 2015066644 A | 4/2015 |
| JP | 2015-124407 A | 7/2015 |
| JP | 2016-003369 A | 1/2016 |
| JP | 2017-056497 A | 3/2017 |
| JP | 2017-124463 A | 7/2017 |
| JP | 2018118346 A | 8/2018 |
| WO | WO-2013/031915 A1 | 3/2013 |
| WO | WO-2018/008554 A1 | 1/2018 |

OTHER PUBLICATIONS

European Search Report mailed May 18, 2022 for the corresponding European Patent Application No. 19902513.1 (7 pages).

Chinese Office Action mailed Aug. 8, 2023 for the corresponding Chinese Patent Application No. 201980093151.7 (16 pages including English translation).

* cited by examiner

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2019/051161 filed on Dec. 26, 2019 and claims the benefit of priority to Japanese Patent Applications No. 2018-243963 filed on Dec. 27, 2018 and No. 2019-227056 filed on Dec. 17, 2019, the contents of all of which are incorporated herein by reference in their entireties. The International Application was published in Japanese on Jul. 2, 2020 as International Publication No. WO/2020/138304 under PCT Article 21(2).

FIELD OF THE INVENTION

The present invention relates to a surface-coated cutting tool (hereinafter, referred to as a coated tool) that exhibits excellent cutting performance over a long-term use because the hard coating layer has excellent chipping resistance even when used for high-speed intermittent cutting of cast iron or the like.

BACKGROUND OF THE INVENTION

In the related art, there are coated tools formed by coating a surface of a tool body of a tungsten carbide (hereinafter, referred to as WC)-based cemented carbide with a Ti—Al-based complex carbonitride layer as a hard coating layer, and these coated tools are known to exhibit excellent wear resistance.

However, although the coated tool of the related art, which is formed by coating with the Ti—Al-based complex carbonitride layer has relatively excellent wear resistance, anomalous wear such as chipping is likely to occur when the coated tool is used under high-speed intermittent cutting conditions or the like, and thus various proposals have been made for improving the hard coating layer.

For example, Japanese Unexamined Patent Application, First Publication No. 2001-341008 describes a titanium aluminum nitride film coated tool in which a coating layer including one layer or multiple layers is provided on a tool body; at least one layer of the coating layer is a titanium aluminum nitride film containing at least titanium, aluminum, and nitrogen; and the titanium aluminum nitride film has a cubic crystal structure, has tensile residual stress, and contains 0.01 to 2% by mass of chlorine.

Further, for example, Published Japanese Translation No. 2011-516722 of the PCT International describes a coated tool coated with a hard material in which an $Al_2O_3$ layer is disposed as an outer layer on a plurality of $Ti_{1-x}Al_xN$ layers and/or $Ti_{1-x}Al_xC$ layers and/or $Ti_{1-x}Al_xCN$ layer (in formulae, x is 0.65 to 0.95) which are formed by CVD.

Further, for example, Japanese Unexamined Patent Application, First Publication No. 2015-124407 describes a coated tool including a coating film having a multilayer structure in which a first unit layer including $Ti_{1-x}Al_xN$ and a second unit layer including $Ti_{1-y}Al_yN$ are alternately laminated, as a plurality of layers, in which the first unit layer has an fcc type crystal structure, and satisfies $0<x<0.65$, and the second unit layer has an hcp type crystal structure, and satisfies $0.65 \le y<1$.

In addition, for example, Japanese Unexamined Patent Application, First Publication No. 2016-3369 describes a coated tool including a hard coating film including a plurality of crystal grains and an amorphous phase between the crystal grains, wherein each of the crystal grains has a structure in which a $Ti_{1-x}Al_xN$ layer having an fcc structure and $Ti_{1-y}Al_yN$ layer having an hcp structure are alternately laminated, and satisfies relationships of $0 \le x<1$, $0<y \le 1$, and $(y-x) \ge 0.1$, and the amorphous phase contains carbide, nitride, or carbonitride of at least one of Ti and Al.

In addition, for example, PCT International Publication No. WO2018/008554 describes a hard film including a lower layer including a titanium aluminum nitride film mainly having an fcc structure and an upper layer including aluminum nitride having an hcp structure, in which the upper layer has a columnar crystal structure, the columnar crystal has an average cross-sectional diameter of 0.05 to 0.6 μm, and a ratio of an X-ray diffraction peak Ia (002) on a (002) plane to an X-ray diffraction peak value Ia (100) on a (100) plane in the upper layer has a relationship of Ia (002)/Ia (100) $\ge 6$.

CITATION LIST

Patent Document

[Patent Document 1]
  Japanese Unexamined Patent Application, First Publication No. 2001-341008
[Patent Document 2]
  Published Japanese Translation No. 2011-516722 of the PCT International Publication
[Patent Document 3]
  Japanese Unexamined Patent Application, First Publication No. 2015-124407
[Patent Document 4]
  Japanese Unexamined Patent Application, First Publication No. 2016-3369
[Patent Document 5]
  PCT International Publication No. WO2018/008554

Technical Problem

However, when the coated tools described in Japanese Unexamined Patent Application, First Publication No. 2001-341008, Published Japanese Translation No. 2011-516722 of the PCT International Publication, Japanese Unexamined Patent Application, First Publication No. 2015-124407 and Japanese Unexamined Patent Application, First Publication No. 2016-3369 are subjected to high-speed intermittent cutting of cast iron or the like, anomalous damage such as thermal cracks occurs in a film on a rake face of the coated tool, and chipping is likely to occur starting from that. Thus, it cannot be said that satisfactory cutting performance is exhibited.

However, when the coated tool described in PCT International Publication No. WO2018/008554 is subjected to high-speed intermittent cutting of cast iron or the like, adhesion between the upper layer and the lower layer is not sufficient, and peeling of the upper layer and chipping starting from it are likely to occur. Thus, it cannot be said that satisfactory cutting performance is exhibited.

Accordingly, an objective of the present invention is to provide a coated tool that exhibits excellent cutting performance over a long-term use because a hard coating layer has excellent anti-chipping even when used for high-speed intermittent cutting of cast iron or the like.

SUMMARY OF THE INVENTION

Solution to Problem

The present inventors conducted extensive studies on chipping occurrence due to an anomalous damage such as thermal cracks of a complex nitride layer or a complex carbonitride layer of Ti and Al as a hard coating layer (hereinafter, this complex nitride layer or a complex carbonitride layer also referred to as a TiAlCN layer), and have found a novel finding that when the TiAlCN layer having a NaCl type face-centered cubic structure having good wear resistance is made close to a tool body (a layer on a tool body side) and a layer having a wurtzite type hexagonal structure (may referred to as a hexagonal crystal) of a TiAlCN layer having good thermal crack resistance is laminated, the chipping resistance is improved in high-speed intermittent cutting of cast iron or the like.

The present invention is based on the finding, and is to provide "(1) a surface-coated cutting tool including:

a tool body and a hard coating layer provided on a surface of the tool body, in which (a) the hard coating layer has a laminated structure having one TiAlCN layer α containing 70 area % or more of crystal grains having a wurtzite type hexagonal structure of a complex nitride or a complex carbonitride of Ti and Al, on a tool surface side and one TiAlCN layer β containing 70 area % or more of crystal grains having a NaCl type face-centered cubic structure of a complex nitride or complex carbonitride of Ti and Al, on a tool body side, (b) when a composition of the TiAlCN layer α is represented by Composition Formula: $(Ti_{(1-x\alpha)}Al_{x\alpha})(C_{y\alpha}N_{(1-y\alpha)})$, an average content ratio xα of Al in a total amount of Ti and Al and an average content ratio yα of C in a total amount of C and N (here, xα and yα are atomic ratios) satisfy $0.70 \leq x\alpha \leq 0.95$ and $0.000 \leq y\alpha \leq 0.010$, (c) when a composition of the TiAlCN layer β is represented by Composition Formula: $(Ti_{(1-x\beta)}Al_{x\beta})(C_{y\beta}N_{(1-y\beta)})$, an average content ratio xβ of Al in a total amount of Ti and Al and an average content ratio yβ of C in a total amount of C and N (here, xβ and yβ are atomic ratios) satisfy $0.65 \leq x\beta \leq 0.95$ and $0.000 \leq y\beta \leq 0.010$, and (d) when average layer thicknesses of the TiAlCN layer α and the TiAlCN layer β are defined as Lα and Lβ, the TiAlCN layer α and the TiAlCN layer β satisfy $0.5\ \mu m \leq L\alpha \leq 10.0\ \mu m$ and $1.0\ \mu m \leq L\beta 20.0\ \mu m$.

(2) The surface-coated cutting tool according to (1), in which a difference between the xα and the xβ satisfies $|x\alpha - x\beta| \leq 0.20$.

(3) The surface-coated cutting tool according to (1) or (2), in which a TiAlCN layer γ containing at least crystal grains having a NaCl type face-centered cubic structure of a complex nitride or a complex carbonitride of Ti and Al, exists between the TiAlCN layer α and the TiAlCN layer β, (a) when a composition of the TiAlCN layer γ is represented by Composition Formula: $(Ti_{(1-x\gamma)}Al_{x\gamma})(C_{y\gamma}N_{(1-y\gamma)})$, xγ satisfies $x\alpha \leq x\gamma \leq x\beta$ or $x\alpha \geq x\gamma \geq x\beta$ and yγ satisfies $0.000 \leq y\gamma \leq 0.010$, regarding an average content ratio xγ of Al in a total amount of Ti and Al and an average content ratio yγ of C in a total amount of C and N (here, xγ and yγ are atomic ratios), and (b) when an average layer thickness of the TiAlCN layer γ is defined as Lγ, $0.1\ \mu m \leq L\gamma \leq 1.0\ \mu m$ is satisfied.

(4) The surface-coated cutting tool according to (1) or (2), in which, when the xα and the xβ satisfy $x\alpha \neq x\beta$, a TiAlCN layer δ containing at least crystal grains having a NaCl type face-centered cubic structure of a complex nitride or a complex carbonitride of Ti and Al, exists between the TiAlCN layer α and the TiAlCN layer β, (a) in the TiAlCN layer δ, an average content ratio xδL of Al in a total amount of Ti and Al and an average content ratio yδL of C in a total amount of C and N (here, xδL and yδL are atomic ratios) when a composition of a region on the tool body side of the TiAlCN layer δ divided into two equal parts in a layer thickness direction of the TiAlCN layer δ is represented by Composition Formula: $(Ti_{(1-x\delta L)}Al_{x\delta L})(C_{y\delta L}N_{(1-y\delta L)})$ and an average content ratio xδH of Al in a total amount of Ti and Al and an average content ratio yδH of C in a total amount of C and N (here, xδH and yδH are atomic ratios) when a composition of a region on the tool surface side of the TiAlCN layer δ divided into two equal parts in the layer thickness direction of the TiAlCN layer δ is represented by Composition Formula: $(Ti_{(1-x\delta H)}Al_{x\delta H})(C_{y\delta H}N_{(1-y\delta H)})$ satisfy $x\alpha \leq x\delta H < x\delta L \leq x\beta$ or $x\beta \leq x\delta L < x\delta H \leq x\alpha$ and $0.000 \leq y\delta H \leq 0.010$ and $0.000 \leq y\delta L \leq 0.010$, and (b) when an average layer thickness of the TiAlCN layer δ is defined as Lδ, the TiAlCN layer δ satisfies $0.1\ \mu m \leq L\delta \leq 1.0\ \mu m$.

(5) The surface-coated cutting tool according to any one of (1) to (4), in which the hard coating layer having the laminated structure of the TiAlCN layer α and the TiAlCN layer β is provided on the rake face of the surface-coated cutting tool, and the TiAlCN layer β is provided on a surface of a flank face."

Advantageous Effects of Invention

The surface-coated cutting tool of the present invention exhibits excellent effects of preventing damage from the rake face to the flank face by preventing thermal cracks on the rake face while maintaining wear resistance on the flank face and long life even in high-speed intermittent cutting of cast iron or the like.

DETAILED DESCRIPTION OF THE INVENTION

Figure 1:
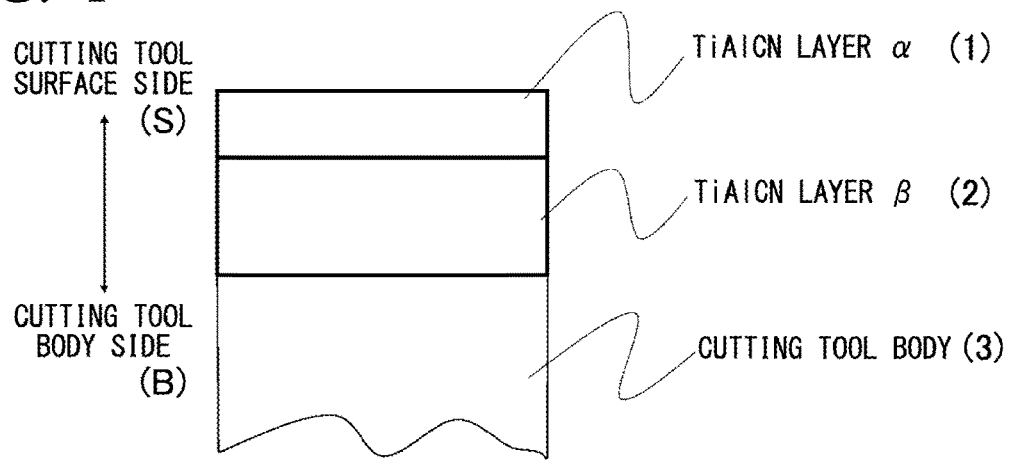
FIG. 1 is a schematic diagram representing an embodiment of a vertical section (a cross section perpendicular to a tool body) of a hard coating layer of a surface-coated cutting tool according to the present invention, in which a TiAlCN layer γ and a TiAlCN layer δ are not provided between a TiAlCN layer α on a tool surface side and a TiAlCN layer β on a tool body side.

Hereinafter, a coated tool of the present invention will be described in more detail. In the descriptions of the present specification and Claims, when a numerical range is expressed by using "to", the range includes numerical values of an upper limit and a lower limit.
Laminated Structure of Hard Coating Layer:

As shown in FIG. 1, the coated tool to the present invention has a laminated structure having one TiAlCN layer α (1) containing 70 area % or more (an upper limit may be 100 area %) of crystal grains having a wurtzite type hexagonal structure of a complex nitride or a complex carbonitride of Ti and Al, on a tool surface side (S) and one TiAlCN layer β (2) containing 70 area % or more (an upper limit may be 100 area %) of crystal grains having a NaCl type face-centered cubic structure of a complex nitride or complex carbonitride of Ti and Al, on the tool body side (B).

The reason for adopting the laminated structure is that when the TiAlCN layer α (1) having good thermal crack resistance is disposed on the tool surface side (S) and the TiAlCN layer β (2) having good wear resistance is disposed on the tool body side (B), thermal cracks on a rake face (5) are prevented from occurring while maintaining the wear resistance in the flank face (6), and furthermore, the damage from the rake face (5) to the flank face (6) can be prevented from occurring, and excellent cutting performance can be exhibited for a long period of time even in high-speed intermittent cutting of cast iron or the like.

Figure 2:
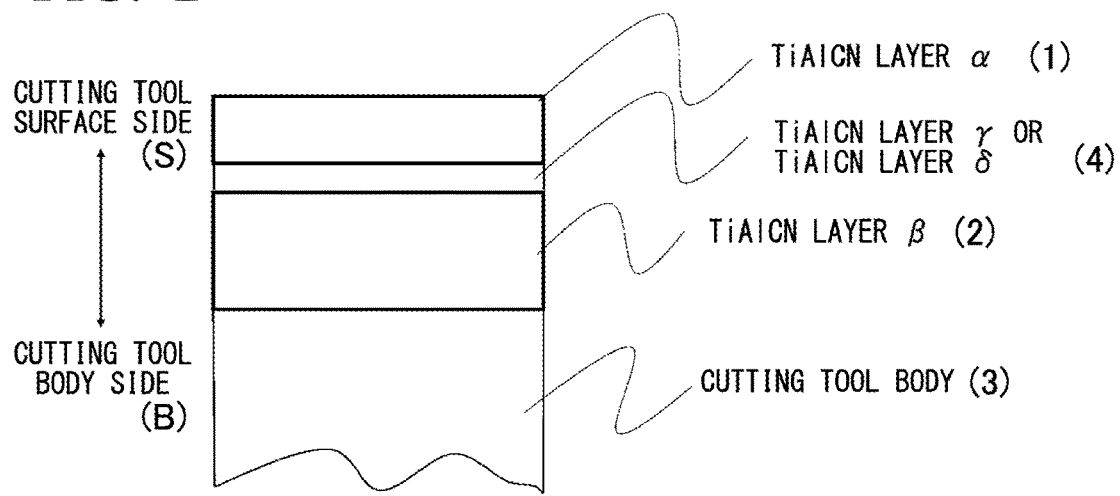
FIG. 2 is a schematic diagram representing another embodiment of a vertical section (a cross section perpendicular to a tool body) of a hard coating layer of a surface-coated cutting tool according to the present invention, in which a TiAlCN layer γ or a TiAlCN layer δ is provided between a TiAlCN layer α on a tool surface side and a TiAlCN layer β on a tool body side.

Further, when both the TiAlCN layer α (1) and the TiAlCN layer β (2) contain Al, the adhesion between the layers can be improved. In addition, as shown in FIG. 2, as needed, in order to improve the adhesion between the TiAlCN layer α (1) and the TiAlCN layer β (2), it is preferable that either a TiAlCN layer γ having a NaCl type face-centered cubic structure or a TiAlCN layer δ having the same structure is provided between the two layers.

Hereinafter, each layer will be described in detail.
TiAlCN Layer α:

The TiAlCN layer α (1) is a layer containing at least crystal grains of a complex nitride or a complex carbonitride of Ti and Al, the crystal grains having a wurtzite type hexagonal structure having excellent thermal crack resistance (thermal shock resistance), and is provided on the tool surface side (S).
Composition of TiAlCN Layer α:

A composition of the TiAlCN layer α (1) is controlled such that when the composition is represented by Composition Formula: $(Ti_{(1-x\alpha)}Al_{x\alpha})(C_{y\alpha}N_{(1-y\alpha)})$, an average content ratio xα of Al in a total amount of Ti and Al and an average content ratio yα of C in a total amount of C and N (here, xα and yα are atomic ratios) satisfy $0.70 \leq x\alpha \leq 0.95$ and $0.000 \leq y\alpha \leq 0.010$.

The reason for setting the xα in the range is that when the xα is less than 0.70, the wurtzite type hexagonal structure is not stably formed and the thermal crack resistance is lowered, which is not preferable, and when xα is more than 0.95, the adhesion to the TiAlCN layer β (2) is lowered and the wear resistance is lowered, which are not preferable. Also, the reason for setting the yα in the range is that when the yα is in the range, lubricity is improved to alleviate impact during cutting and improve chipping resistance, and when the yα is out of the range, the adhesion to the TiAlCN layer β (2) is reduced.
Average Layer Thickness of TiAlCN Layer α:

The average layer thickness Lα of the TiAlCN layer α (1) is preferably 0.5 μm to 10.0 μm. The reason for setting the range is that when the average layer thickness is less than 0.5 μm, the hard coating layer is worn out at an early stage even on the rake face (5), the effect of improving the thermal crack resistance is not exhibited, and when the average layer thickness is more than 10.0 μm, the crystal grains become coarse and the chipping resistance is lowered. The average layer thickness range is more preferably 1.0 μm to 3.0 μm.
Area Ratio of Crystal Grains Having Wurtzite Type Hexagonal Structure in TiAlCN Layer α:

The area ratio of the crystal grains having a wurtzite type hexagonal structure in the TiAlCN layer α (1) is 70 area % or more. When the area ratio is not 70 area % or more, the amount of the crystal grains having a wurtzite type hexagonal structure is not sufficient, and the thermal crack resistance and the chipping resistance are lowered. The area ratio is more preferably 85 area % or more, and may also be 100 area %.
TiAlCN Layer β:

The TiAlCN layer β (2) is a layer containing at least crystal grains of a complex nitride or a complex carbonitride of Ti and Al, the crystal grains having a NaCl type face-centered cubic structure having excellent wear resistance, and is provided on the tool body side (B).
Composition of TiAlCN Layer β:

A composition of the TiAlCN layer β (2) is controlled such that when the composition is represented by Composition Formula: $(Ti_{(1-x\beta)}Al_{x\beta})(C_{y\beta}N_{(1-y\beta)})$, an average content ratio xβ of Al in a total amount of Ti and Al and an average content ratio yβ of C in a total amount of C and N (here, xβ and yβ are atomic ratios) satisfy $0.65 \leq x\beta \leq 0.95$ and $0.000 \leq y\beta \leq 0.010$.

The reason for setting the xβ in the range is that when the xβ is less than 0.65, the hardness of the TiAlCN layer β (2) is reduced and the wear resistance is not sufficient, and when the xβ is more than 0.95, the Ti content ratio is relatively reduced, and thus it is likely to contain the crystal grains having a wurtzite type hexagonal structure to lead to decrease in the wear resistance, which is not preferable. Further, when the yβ is in the range, the adhesion between the TiAlCN layer β (2) and the tool body (3) or a lower layer to be described later is improved, the lubricity is improved to alleviate the impact during cutting, and the chipping resistance and fracturing resistance of the TiAlCN layer β (2) are improved. On the other hand, when the yβ is out of the range, the adhesion to the TiAlCN layer α (1) is lowered, which is not preferable.
Average Layer Thickness of TiAlCN Layer β:

The average layer thickness Lβ of the TiAlCN layer β (2) is preferably 1.0 μm to 20.0 μm. The reason for setting the range is that when the average layer thickness is less than 1.0 μm, sufficient wear resistance cannot be ensured over a long-term use because the layer thickness is thin. On the other hand, when the average layer thickness is more than 20.0 μm, the crystal grains of the TiAlCN layer β (2) is easy to be coarsened and chipping is likely to occur, which is not preferable. The average layer thickness range is more preferably 5.0 μm to 12.0 μm.

Area Ratio of Crystal Grains Having NaCl Type Face-Centered Cubic Structure in TiAlCN Layer β:

The area ratio of the crystal grains having a NaCl type face-centered cubic structure in the TiAlCN layer β (2) is 70 area % or more. When the area ratio is not 70 area % or more, the wear resistance is lowered, the flank face (6) is easily worn, and the life of the coated tool is reached at an early stage. The area ratio is more preferably 85 area % or more, and may also be 100 area %.

Composition Difference Between Average Content Ratio $x\alpha$ of Al in TiAlCN Layer α and Average Content Ratio $x\beta$ of Al in TiAlCN Layer β:

The composition difference between the average content ratio $x\alpha$ of Al in the TiAlCN layer α (1) and the average content ratio $x\beta$ of Al in the TiAlCN layer β (2) is preferably $|x\alpha-x\beta|\leq 0.20$, that is, $-0.20\leq x\alpha-x\beta\leq 0.20$. When the difference is in the range, the adhesion between the TiAlCN layer α (1) and the TiAlCN layer β (2) is enhanced, and it becomes easy to prevent chipping after the occurrence of thermal cracks from occurring.

TiAlCN Layer γ:

In order to improve the adhesion between the TiAlCN layer α (1) and the TiAlCN layer β (2), it is preferable that a TiAlCN layer γ (4) having a NaCl type face-centered cubic structure is provided between the two layers.

Composition of TiAlCN Layer γ:

When a composition of the TiAlCN layer γ (4) is represented by Composition Formula: $(Ti_{(1-x\gamma)}Al_{x\gamma})(C_{y\gamma}N_{(1-y\gamma)})$, an average content ratio $x\gamma$ of Al in a total amount of Ti and Al and an average content ratio and the average content ratio $y\gamma$ of C in a total amount of C and N (here, $x\gamma$ and $y\gamma$ are atomic ratios) satisfy $x\alpha\leq x\gamma\leq x\beta$ or $x\alpha\leq x\gamma\leq x\beta$, and are preferably $0.000\leq y\gamma\leq 0.010$. When providing the TiAlCN layer γ (4) having the composition, an initial nucleation of the crystal grains of the TiAlCN layer α (1) is easily formed and a nucleation density can be raised, and adhesion between the TiAlCN layer α (1) and the TiAlCN layer β (2) can be enhanced to get higher chipping resistance.

Average Layer Thickness of TiAlCN Layer γ:

The average layer thickness of the TiAlCN layer γ is 0.1 to 1.0 μm. The reason for setting the range is that when the average layer thickness is less than 0.1 μm, the TiAlCN layer γ has too thin average layer thickness, and a region of the TiAlCN layer β (2) which is not sufficiently coated with the TiAlCN layer γ, and when the average layer thickness is more than 1.0 μm, the crystal grains of the TiAlCN layer γ become coarse, and the initial nucleation of the crystal grains of the TiAlCN layer α (1) is not sufficiently formed and the nucleation density is low. In either case, enhancement in the adhesion between the TiAlCN layer α (1) and the TiAlCN layer β (2) cannot be expected.

TiAlCN Layer δ:

When the $x\alpha$ and the $x\beta$ satisfy $x\alpha\neq x\beta$, in order to enhance the adhesion between the TiAlCN layer α (1) and the TiAlCN layer β (2), it is further preferable that a TiAlCN layer δ having a NaCl type face-centered cubic structure is provided between the two layers, instead of the TiAlCN layer γ.

Composition of TiAlCN Layer δ:

When the TiAlCN layer δ is divided into two equal parts in a layer thickness direction of the TiAlCN layer δ, it is preferable that an average content ratio $x\delta L$ of Al in a total amount of Ti and Al and an average content ratio $y\delta L$ of C in a total amount of C and N (here, $x\delta L$ and $y\delta L$ are atomic ratios) when a composition of a region on the tool body side (B) is represented by Composition Formula: $(Ti_{(1-x\delta L)}Al_{x\delta L})(C_{y\delta L}N_{(1-y\delta L)})$ and an average content ratio $x\delta H$ of Al in a total amount of Ti and Al and an average content ratio $y\delta H$ of C in a total amount of C and N (here, $x\delta H$ and $y\delta H$ are atomic ratios) when a composition of a region on the tool surface side (S) is represented by Composition Formula: $(Ti_{(1-x\delta H)}Al_{x\delta H})(C_{y\delta H}N_{(1-y\delta H)})$ satisfy $x\alpha\leq x\delta H<x\delta L\leq x\beta$ or $x\beta\leq x\delta L<x\delta H\leq x\alpha$ and $0.000\leq y\delta H\leq 0.010$ and $0.000\leq y\delta L\leq 0.010$.

When specifying the composition as above, the adhesion between the TiAlCN layer β (2) and the TiAlCN layer δ (4) can further be enhanced by bringing the $x\beta$ in the TiAlCN layer β (2) closer to the $x\delta L$ of the TiAlCN layer δ. In addition, the adhesion between the TiAlCN layer α (1) and the TiAlCN layer δ (4) can also be enhanced by bringing the $x\alpha$ in the TiAlCN layer α (1) and the $x\delta H$ of the TiAlCN layer δ (4) close to each other, and the adhesion between the TiAlCN layer α (1) and the TiAlCN layer β (2) can be enhanced to get higher chipping resistance.

Average Layer Thickness of TiAlCN Layer δ:

The average layer thickness of the TiAlCN layer δ (4) is 0.1 to 1.0 μm. The reason for setting the range is that when the average layer thickness is less than 0.1 μm, the TiAlCN layer δ (4) has too thin average layer thickness, and a region of the TiAlCN layer β (2) which is not sufficiently coated with the TiAlCN layer δ (4), and when the average layer thickness is more than 1.0 μm, the crystal grains of the TiAlCN layer δ (4) become coarse, and the initial nucleation of the crystal grains of the TiAlCN layer α (1) is not sufficiently formed and the nucleation density is low. Accordingly, in either case, enhancement in the adhesion between the TiAlCN layer α (1) and the TiAlCN layer β (2) cannot be expected.

Figure 3:
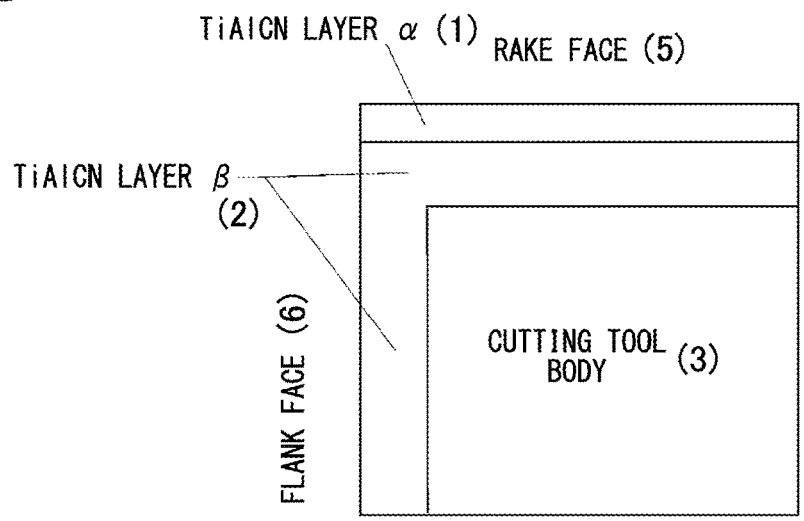
FIG. 3 is a schematic diagram representing still another embodiment of a vertical section (a cross section perpendicular to a tool body) of a hard coating layer of a surface-coated cutting tool according to the present invention, in which a hard coating layer having a laminated structure of a TiAlCN layer α and a TiAlCN layer β are provided on a rake face and a TiAlCN layer β is provided on a flank face.

Hard Coating Layer Having Laminated Structure Containing TiAlCN Layer α and TiAlCN Layer β on Rake Face, and TiAlCN Layer β on Surface of Flank Face:

As shown in FIG. 3, it is preferable that the hard coating layer having a laminated structure including the TiAlCN layer α (1) and the TiAlCN layer β (2) is provided on the rake face (5) and the TiAlCN layer β (2) is provided on the surface of the flank face (6). The TiAlCN layer α (1) may be provided on the flank face (6), but when the TiAlCN layer α (1) having low wear resistance does not exist on the surface of the flank face (6) that most rubs against a work material, it is possible to prevent the TiAlCN layer α (1) together with the TiAlCN layer β (2) from falling off, and the tool life is further prolonged.

Other Layers:

The hard coating layer having the laminated structure of the present invention may include other layers. For example, when a lower layer having a Ti-compound layer which is formed of one or more layers among a carbide layer, a nitride layer, a carbonitride layer, a carbonic acid layer, and a oxycarbonitride layer of Ti, and has an average total layer thickness of 0.1 to 20.0 μm is provided adjacent to the tool body (3), along with the effects of the layers, it is possible to exhibit even better wear resistance and thermal stability.

Here, when the average total layer thickness of the lower layer is less than 0.1 μm, the effect of the lower layer is not sufficiently exhibited. On the other hand, when the average total layer thickness is more than 20.0 μm, the crystal grains of the lower layer are likely to be coarsened and chipping is likely to occur.

Measurement Method of Boundary, Average Layer Thickness, Composition, Crystal Structure, and Area Ratio of Each TiAlCN Layer of TiAlCN Layer α, TiAlCN Layer β, TiAlCN Layer γ, TiAlCN Layer δ:

A boundary between TiAlCN layers of the TiAlCN layer α (1), the TiAlCN layer β (2), the TiAlCN layer γ (4), and the TiAlCN layer δ (4) is determined in a manner that: a vertical section (a cross section perpendicular to the tool body) obtained by polishing the hard coating layer is prepared using a focused ion beam device (FIB: Focused Ion Beam system), a cross section polisher (CP), and the like; in the vertical section, a quadrangle in which the vertical direction is the thickness of the entire hard coating layer and the transverse direction is 100 μm parallel to the tool body is set as a measurement area; and a crystal structure of each crystal grain is analyzed using an electron beam backscatter analysis device based on an electron beam backscatter diffraction image obtained by irradiating the measurement area with an electron beam having an acceleration voltage of 15 kV and an irradiation current of 1 nA at an incident angle of 70 degrees with a step of 0.01 μm.

A point where there is an orientation difference of 5 degrees or more between adjacent measurement points (pixels) is defined as the grain boundary. However, a pixel that exists independently and has the orientation difference of 5 degrees or more from all adjacent pixels is not treated as a crystal grain, and one that is connected by 2 pixels or more is treated as the crystal grain.

By determining each crystal grain and distinguishing the crystal structure thereof as above, each layer is specified, and an area ratio of the crystal grains having the wurtzite type hexagonal structure or the NaCl type face-centered cubic structure in each layer can be determined.

When the boundary of each layer of the TiAlCN layers is defined, the average layer thickness can be determined between the boundary areas of the defined each layer, and an average content ratio (xα, xβ, xγ, xδL, and xδH) of Al in each layer can be determined irradiating the layer with an electron beam using an Auger electron spectroscopy and performing a plurality of line analyzes (for example, 5 or more lines) in the layer thickness direction, and averaging the analysis results obtained.

Further, the average content ratio of C (yα, yβ, yγ, yδL, and yδH) of each layer can be determined for each layer by secondary ion mass spectrometry. That is, the content ratio in a depth direction is measured by alternately repeating the surface analysis using an ion beam and etching using a sputtered ion beam. Specifically, in each of the TiAlCN layers, an average value obtained by measuring at least 0.5 μm of length at a pitch of 0.1 μm or less is determined from the points where penetration occurs by 0.5 μm or more, and this operation is performed at 5 or more points to obtain the average content ratio of C in each layer.

Tool Body:

As the tool body (3), any base material known in the related art as the type of a tool body can be used as long as the material does not hinder the achievement of the objective of the present invention. For example, the tool body is preferably any one of a cemented carbide (such as a WC-based cemented carbide and cemented carbide containing Co in addition to WC and further containing carbonitrides such as Ti, Ta, and Nb), cermet (cermet containing TiC, TiN, TiCN, and the like as main components), ceramics (such as titanium carbide, silicon carbide, silicon nitride, aluminum nitride, and aluminum oxide), or a cBN sintered material.

Production Method:

Each TiAlCN layer of the present invention can be obtained, for example, supplying two kinds of reaction gases including a gas group A and a gas group B having the following compositions, with a predetermined phase difference on the tool body or at least one or more layers of a carbide layer, a nitride layer, a carbonitride layer, a oxycarbide layer, and a oxycarbonitride layer of Ti on the tool body.

As an example of the gas composition of the reaction gas is as follows, and % represents a % by volume (the sum of the gas group A and the gas group B is the whole).

(1) Reaction Gas α for Forming TiAlCN Layer α
  Gas group A: 5.0 to 10.0% of $NH_3$, 3.0 to 5.0% of $N_2$, 1.0 to 5.0% of Ar, and 50 to 60% of $H_2$
  Gas group B: 0.70 to 1.20% of $AlCl_3$, 0.10 to 0.30% of $TiCl_4$, 3.0 to 12.0% of $N_2$, 0.00 to 0.10% of HCl, 0.0 to 0.5% of $C_2H_4$, and $H_2$ as a balance
  Reaction atmosphere pressure: 4.5 to 5.0 kPa
  Reaction atmosphere temperature: 750 to 950° C.
  Supply cycle: 4.0 to 12.0 seconds
  Gas supply time per cycle: 0.20 to 0.70 seconds
  Phase difference between supply of gas group A and gas group B: 0.18 to 0.60 seconds (2) Reaction Gas β for Forming TiAlCN Layer β
  Gas group A: 1.0 to 2.0% of $NH_3$, 1.0 to 5.0% of Ar, and 50 to 60% of $H_2$
  Gas group B: 0.60 to 1.40% of $AlCl_3$ and 0.05 to 0.50% of $TiCl_4$, 0.0 to 5.0% of $N_2$, 0.0 to 0.5% of $C_2H_4$, and $H_2$ as a balance
  Reaction atmosphere pressure: 4.5 to 5.0 kPa
  Reaction atmosphere temperature: 700 to 850° C.
  Supply cycle: 4.0 to 12.0 seconds
  Gas supply time per cycle: 0.20 to 0.70 seconds
  Phase difference between supply of gas group A and gas group B: 0.18 to 0.60 seconds (3) Reaction Gases γ and δ for Forming TiAlCN Layers γ and δ
  Gas group A: 3.0 to 4.0% of $NH_3$, 1.0 to 2.0% of $N_2$, 1.0 to 5.0% of Ar, and 50 to 60% of $H_2$
  Gas group B: 0.6 to 1.2% of $AlCl_3$ and 0.10 to 0.30% of $TiCl_4$, 0.0 to 5.0% of $N_2$, 0.0 to 0.5% of $C_2H_4$, and $H_2$ as a balance
  Reaction atmosphere pressure: 4.5 to 5.0 kPa
  Reaction atmosphere temperature: 700 to 850° C.
  Supply cycle: 4.0 to 12.0 seconds
  Gas supply time per cycle: 0.20 to 0.70 seconds
  Phase difference between supply of gas group A and gas group B: 0.18 to 0.60 seconds In the formation of the TiAlCN layer δ, a gas composition change is linear (gradient change) from the start of film formation to the end of film formation of the same layer, or the TiAlCN layer δ can be formed by fixing the composition for a certain period of time a plurality of times while changing the gas composition from the start of film formation to the end of film formation of the same layer.

EXAMPLES

Next, examples will be described.

Here, as a specific example of the coated tool of the present invention, a coated tool applied to an insert cutting tool using the WC-based cemented carbide as the tool body will be described, but the same is applied to a case where the above-described other tool bodies are used as the tool body, and the same is applied to the case where it is applied to a drill, an end mill, or the like.

Example 1

As raw material powders, a WC powder, a TiC powder, a TaC powder, a NbC powder, a $Cr_3C_2$ powder, and a Co powder all having an average particle size of 1 to 3 μm were prepared. These raw material powders were blended to have a blending composition shown in Table 1, and a wax was further added and subjected to ball-mill mixing in acetone for 24 hours. The mixture was dried under a reduced pressure. Then, the mixture was press-molded into a green compact having a predetermined shape at a pressure of 98 MPa, and the press-molded body was vacuum-sintered in a vacuum of 5 Pa under conditions at a predetermined temperature in a range of 1370 to 1470° C. for a holding time of 1 hour. After the sintering, tool bodies A to C made of the WC-based cemented carbide having an insert shape of ISO standard SEEN 1203 AFSN were produced.

Next, a TiAlCN layer was formed on the surfaces of the tool bodies A to C by CVD using a CVD apparatus to obtain coated tools 1 to 10 of the present invention shown in Table 7.

The film forming conditions are as shown in Tables 2 to 4, but are generally as follows. % of the gas composition is the % by volume (the sum of the gas group A and the gas group B is the whole (100% by volume)).

(1) Reaction Gas α for Forming TiAlCN Layer α (Table 2)
  Gas group A: 5.0 to 10.0% of $NH_3$, 3.0 to 5.0% of $N_2$, 1.0 to 5.0% of Ar, and 50 to 60% of $H_2$
  Gas group B: 0.70 to 1.20% of $AlCl_3$, 0.10 to 0.30% of $TiCl_4$, 3.0 to 12.0% of $N_2$, 0.00 to 0.10% of HCl, 0.0 to 0.5% of $C_2H_4$, and $H_2$ as a balance
  Reaction atmosphere pressure: 4.5 to 5.0 kPa
  Reaction atmosphere temperature: 750 to 950° C.
  Supply cycle: 4.0 to 12.0 seconds
  Gas supply time per cycle: 0.20 to 0.70 seconds
  Phase difference between supply of gas group A and gas group B: 0.18 to 0.60 seconds (2) Reaction Gas β for Forming TiAlCN Layer β (Table 3)
  Gas group A: 1.0 to 2.0% of $NH_3$, 1.0 to 5.0% of Ar, and 50 to 60% of $H_2$
  Gas group B: 0.60 to 1.40% of $AlCl_3$ and 0.05 to 0.50% of $TiCl_4$, 0.0 to 5.0% of $N_2$, 0.0 to 0.5% of $C_2H_4$, and $H_2$ as a balance
  Reaction atmosphere pressure: 4.5 to 5.0 kPa
  Reaction atmosphere temperature: 700 to 850° C.
  Supply cycle: 4.0 to 12.0 seconds
  Gas supply time per cycle: 0.20 to 0.70 seconds
  Phase difference between supply of gas group A and gas group B: 0.18 to 0.60 seconds (3) Reaction Gases γ and δ for Forming TiAlCN Layers γ and δ (Table 4)
  Gas group A: 3.0 to 4.0% of $NH_3$, 1.0 to 2.0% of $N_2$, 1.0 to 5.0% of Ar, and 50 to 60% of $H_2$
  Gas group B: 0.6 to 1.2% of $AlCl_3$ and 0.10 to 0.30% of $TiCl_4$, 0.0 to 5.0% of $N_2$, 0.0 to 0.5% of $C_2H_4$, and $H_2$ as a balance
  Reaction atmosphere pressure: 4.5 to 5.0 kPa
  Reaction atmosphere temperature: 700 to 850° C.
  Supply cycle: 4.0 to 12.0 seconds
  Gas supply time per cycle: 0.20 to 0.70 seconds
  Phase difference between supply of gas group A and gas group B: 0.18 to 0.60 seconds As shown in Table 4, TiAlCN layer γ had no change in the gas composition, and in the formation of the TiAlCN layer δ, a gas composition change is L (gradient change) from the start of film formation to the end of film formation of the same layer, or S (stepwise change) of fixing the composition for a certain period of time a plurality of times while changing the gas composition from the start of film formation to the end of film formation of the same layer.

Further, in the coated tool of the present invention in which the hard coating layer on the flank face is only the TiAlCN layer β, the TiAlCN layer α on the flank face is removed by polishing using an elastic grindstone.

The coated tools 4 to 6 and 8 to 10 of the present invention were formed to have the lower layer shown in Table 6 under the film forming conditions shown in Table 5.

For the objective of comparison, comparative coated tools 1 to 10 shown in Table 7 were produced by film formation on the surfaces of the tool bodies A to C by a CVD apparatus under the conditions shown in Tables 2 to 4.

The comparative coated tools 4 to 6 and 8 to 10 were formed to have the lower layer shown in Table 6 under the film forming conditions shown in Table 5.

For the coated tools 1 to 10 of the present invention and the comparative coated tools 1 to 10, the composition of each TiAlCN layer, the average layer thickness, the area ratio of the crystal grains of the wurtzite type hexagonal structure, and the area ratio of the crystal grains having the NaCl type face-centered cubic structure were determined using the above method, and the results thereof are shown in Table 7.

TABLE 1

| Type | | Blending composition (% by mass) | | | | | |
|---|---|---|---|---|---|---|---|
| | | Co | TiC | TaC | NbC | $Cr_3C_2$ | WC |
| Tool body | A | 6.0 | — | 0.4 | 0.6 | — | Balance |
| | B | 8.5 | 1.1 | — | — | 0.3 | Balance |
| | C | 10 | — | — | — | 1.0 | Balance |

TABLE 2

| Formation of TiAlCN layer α | | Gas composition of reaction gas α | | | | | | | | | | Reaction condition of reaction gas α Gas |
|---|---|---|---|---|---|---|---|---|---|---|---|---|
| Type of film formation step | Formation symbol | Composition of reaction gas group A (% by volume) | | | | Composition of reaction gas group B (% by volume) | | | | | | group A Supply cycle |
| | | $NH_3$ | $N_2$ | Ar | $H_2$ | $AlCl_3$ | $TiCl_4$ | $N_2$ | HCl | $C_2H_4$ | $H_2$ | (Second) |
| Step of present invention | A | 7.0 | 3.5 | 3.2 | 53 | 0.80 | 0.10 | 6.0 | 0.01 | 0.1 | Balance | 4.1 |
| | B | 5.5 | 3.0 | 3.5 | 50 | 1.10 | 0.10 | 5.0 | 0.04 | 0.0 | Balance | 6.9 |
| | C | 10.0 | 4.5 | 1.0 | 56 | 0.70 | 0.30 | 12.0 | 0.03 | 0.2 | Balance | 12.0 |
| | D | 5.6 | 3.0 | 5.0 | 55 | 0.70 | 0.12 | 6.0 | 0.06 | 0.4 | Balance | 10.2 |
| | E | 7.5 | 5.0 | 1.5 | 54 | 1.20 | 0.10 | 10.0 | 0.05 | 0.0 | Balance | 10.0 |
| | F | 6.1 | 4.3 | 2.0 | 60 | 0.80 | 0.30 | 11.0 | 0.07 | 0.5 | Balance | 5.5 |
| | G | 6.0 | 3.2 | 4.0 | 57 | 1.15 | 0.10 | 6.0 | 0.00 | 0.0 | Balance | 11.0 |
| | H | 5.7 | 3.0 | 3.0 | 55 | 0.90 | 0.10 | 11.0 | 0.09 | 0.3 | Balance | 4.0 |
| | I | 8.6 | 4.0 | 2.0 | 53 | 0.90 | 0.25 | 3.0 | 0.10 | 0.0 | Balance | 6.3 |
| | J | 5.0 | 4.0 | 4.0 | 50 | 1.00 | 0.17 | 4.0 | 0.00 | 0.0 | Balance | 5.0 |

TABLE 2-continued

| | | | | | | | | | | | |
|---|---|---|---|---|---|---|---|---|---|---|---|
| Step for comparison | A' | 10.0 | 2.0 | 1.035 | 1.50 | 0.10 | 3.0 | 1.00 | 0.1 | Balance | 4.1 |
| | B' | 2.0 | 4.3 | 1.045 | 0.20 | 0.20 | 3.0 | 0.10 | 0.0 | Balance | 6.9 |
| | C' | 3.0 | 2.0 | 3.058 | 0.60 | 0.20 | 3.0 | 2.00 | 5.0 | Balance | 12.0 |
| | D' | 1.0 | 0.0 | 0.060 | 0.30 | 0.30 | 3.0 | 1.50 | 0.0 | Balance | 10.2 |
| | E' | 9.0 | 8.0 | 0.050 | 1.10 | 0.00 | 10.0 | 0.00 | 0.0 | Balance | 10.0 |
| | F' | 4.0 | 2.0 | 2.357 | 0.80 | 0.30 | 4.0 | 0.00 | 0.4 | Balance | 5.5 |
| | G' | 3.5 | 2.1 | 6.341 | 1.80 | 0.60 | 4.0 | 5.00 | 0.0 | Balance | 11.0 |
| | H' | 3.0 | 2.0 | 4.155 | 0.90 | 0.90 | 1.5 | 2.10 | 0.4 | Balance | 4.0 |
| | I' | 7.3 | 10.0 | 0.056 | 2.00 | 0.10 | 3.0 | 1.00 | 0.0 | Balance | 6.3 |
| | J' | 2.3 | 4.0 | 4.050 | 1.70 | 0.27 | 4.0 | 0.00 | 0.0 | Balance | 5.0 |

| Formation of TiAlCN layer α | | Reaction condition of reaction gas α | | | | |
|---|---|---|---|---|---|---|
| Type of film formation step | Formation symbol | Gas group A Supply time per cycle (Second) | Supply per cycle (Second) | Gas group B Supply time per cycle (Second) | Phase difference between supply of gas group A and gas group B (Second) | Reaction atmosphere Pressure (kPa) / Temperature (° C.) |
| Step of present invention | A | 0.27 | 4.1 | 0.27 | 0.25 | 4.6 / 800 |
| | B | 0.52 | 6.9 | 0.52 | 0.44 | 4.7 / 900 |
| | C | 0.40 | 12.0 | 0.40 | 0.18 | 4.5 / 950 |
| | D | 0.20 | 10.2 | 0.20 | 0.30 | 4.8 / 900 |
| | E | 0.70 | 10.0 | 0.70 | 0.55 | 4.9 / 950 |
| | F | 0.65 | 5.5 | 0.65 | 0.60 | 4.8 / 750 |
| | G | 0.30 | 11.0 | 0.30 | 0.50 | 5.0 / 750 |
| | H | 0.40 | 4.0 | 0.40 | 0.35 | 4.7 / 850 |
| | I | 0.50 | 6.3 | 0.50 | 0.60 | 5.0 / 850 |
| | J | 0.60 | 5.0 | 0.60 | 0.58 | 4.6 / 900 |
| Step for comparison | A' | 0.27 | 4.1 | 0.27 | 0.25 | 4.6 / 800 |
| | B' | 0.52 | 6.9 | 0.52 | 0.44 | 4.7 / 650 |
| | C' | 0.40 | 12.0 | 0.40 | 0.18 | 4.5 / 850 |
| | D' | 0.20 | 10.2 | 0.20 | 0.30 | 4.8 / 1000 |
| | E' | 0.70 | 10.0 | 0.70 | 0.65 | 4.9 / 900 |
| | F' | 0.65 | 5.5 | 0.65 | 0.70 | 4.8 / 800 |
| | G' | 0.30 | 11.0 | 0.30 | 0.50 | 5.0 / 950 |
| | H' | 0.40 | 4.0 | 0.40 | 0.35 | 4.7 / 700 |
| | I' | 0.50 | 6.3 | 0.50 | 0.60 | 4.8 / 1050 |
| | J' | 0.60 | 5.0 | 0.60 | 0.58 | 4.6 / 650 |

TABLE 3

| Formation of TiAlCN layer β | | Gas composition of reaction gas β | | | | | | | | Reaction condition of reaction gas β Gas group A Supply cycle (Second) |
|---|---|---|---|---|---|---|---|---|---|---|
| Type of film formation step | Formation symbol | Composition of reaction gas group A (% by volume) | | | Composition of reaction gas group B (% by volume) | | | | | |
| | | $NH_3$ | Ar | $H_2$ | $AlCl_3$ | $TiCl_4$ | $N_2$ | $C_2H_4$ | $H_2$ | |
| Step of present invention | A | 1.0 | 4.3 | 58 | 0.65 | 0.30 | 1.8 | 0.0 | Balance | 4.1 |
| | B | 1.8 | 1.3 | 52 | 1.00 | 0.20 | 0.5 | 0.1 | Balance | 6.9 |
| | C | 1.2 | 3.6 | 54 | 0.88 | 0.05 | 1.8 | 0.1 | Balance | 12.0 |
| | D | 1.6 | 4.7 | 56 | 0.95 | 0.10 | 3.9 | 0.0 | Balance | 10.2 |
| | E | 1.8 | 5.0 | 53 | 0.95 | 0.50 | 2.8 | 0.3 | Balance | 10.0 |
| | F | 1.9 | 3.2 | 60 | 0.90 | 0.20 | 0.0 | 0.2 | Balance | 5.5 |
| | G | 2.0 | 1.0 | 50 | 0.80 | 0.35 | 3.6 | 0.0 | Balance | 11.0 |
| | H | 1.4 | 1.5 | 55 | 0.60 | 0.07 | 5.0 | 0.0 | Balance | 4.0 |
| | I | 1.2 | 2.6 | 52 | 1.40 | 0.30 | 4.0 | 0.1 | Balance | 6.3 |
| | J | 1.3 | 3.3 | 53 | 0.75 | 0.30 | 4.5 | 0.2 | Balance | 5.0 |
| Step for comparison | A' | 5.0 | 1.0 | 70 | 1.20 | 0.20 | 1.0 | 0.0 | Balance | 4.1 |
| | B' | 1.0 | 3.0 | 55 | 0.30 | 0.20 | 1.0 | 0.0 | Balance | 6.9 |
| | C' | 3.0 | 2.0 | 40 | 0.80 | 0.10 | 0.0 | 5.0 | Balance | 12.0 |
| | D' | 6.0 | 0.0 | 30 | 2.00 | 0.20 | 2.0 | 0.0 | Balance | 10.2 |
| | E' | 2.0 | 5.0 | 53 | 1.00 | 0.50 | 5.0 | 0.3 | Balance | 10.0 |
| | F' | 3.0 | 1.0 | 45 | 0.00 | 0.70 | 1.0 | 0.0 | Balance | 5.5 |
| | G' | 2.0 | 1.0 | 50 | 0.80 | 0.35 | 3.6 | 0.0 | Balance | 11.0 |

TABLE 3-continued

|  |  |  |  |  |  |  |  |  |  |
|---|---|---|---|---|---|---|---|---|---|
| H' | 2.0 | 1.2 | 53 | 0.60 | 0.60 | 0.0 | 0.0 | Balance | 4.0 |
| I' | 1.5 | 2.1 | 50 | 1.40 | 0.30 | 3.0 | 0.1 | Balance | 6.3 |
| J' | 1.3 | 3.3 | 53 | 0.75 | 0.30 | 4.5 | 0.2 | Balance | 5.0 |

| Formation of TiAlCN layer β | | Reaction condition of reaction gas β | | | | |
|---|---|---|---|---|---|---|
| Type of film formation step | Formation symbol | Gas group A Supply time per cycle (Second) | Gas group B Supply time per cycle (Second) | Phase difference between supply of gas group A and gas group B (Second) | Reaction atmosphere Pressure (kPa) | Temperature (° C.) |
| Step of present invention | A | 0.27 | 4.1 | 0.27 | 0.25 | 4.6 | 700 |
|  | B | 0.52 | 6.9 | 0.52 | 0.44 | 4.7 | 700 |
|  | C | 0.40 | 12.0 | 0.40 | 0.18 | 4.5 | 800 |
|  | D | 0.20 | 10.2 | 0.20 | 0.30 | 4.8 | 850 |
|  | E | 0.70 | 10.0 | 0.70 | 0.55 | 4.9 | 700 |
|  | F | 0.65 | 5.5 | 0.65 | 0.60 | 4.8 | 750 |
|  | G | 0.30 | 11.0 | 0.30 | 0.50 | 5.0 | 750 |
|  | H | 0.40 | 4.0 | 0.40 | 0.35 | 4.7 | 850 |
|  | I | 0.50 | 6.3 | 0.50 | 0.60 | 5.0 | 800 |
|  | J | 0.60 | 5.0 | 0.60 | 0.58 | 4.6 | 800 |
| Step for comparison | A' | 0.27 | 4.1 | 0.27 | 0.25 | 4.6 | 950 |
|  | B' | 0.52 | 6.9 | 0.52 | 0.44 | 6.0 | 750 |
|  | C' | 0.40 | 12.0 | 0.40 | 0.18 | 4.5 | 800 |
|  | D' | 0.20 | 10.2 | 0.20 | 0.30 | 4.8 | 900 |
|  | E' | 0.70 | 10.0 | 0.70 | 0.65 | 4.9 | 750 |
|  | F' | 0.65 | 5.5 | 0.65 | 0.70 | 4.8 | 950 |
|  | G' | 0.30 | 11.0 | 0.30 | 0.50 | 5.0 | 800 |
|  | H' | 0.40 | 4.0 | 0.40 | 0.35 | 4.7 | 800 |
|  | I' | 0.50 | 6.3 | 0.50 | 0.60 | 4.8 | 750 |
|  | J' | 0.60 | 5.0 | 0.60 | 0.58 | 4.6 | 800 |

TABLE 4

| Formation of TiAlCN layer γ or δ | | Gas composition of reaction gas γ or δ | | | | | | | | | Reaction condition of reaction gas γ or δ | |
|---|---|---|---|---|---|---|---|---|---|---|---|---|
| Type of film formation step | Formation symbol | Composition of reaction gas group A (% by volume) | | | | Composition of reaction gas group B (% by volume) | | | | | Change in gas composition * | Gas group A Supply cycle (Second) |
|  |  | NH$_3$ | N$_2$ | Ar | H$_2$ | AlCl$_3$ | TiCl$_4$ | N$_2$ | C$_2$H$_4$ | H$_2$ |  |  |
| Step of present invention | C | 3.3 | 1.9 | 5.0 | 55 | 1.2 | 0.10 | 1.7 | 0.0 | Balance | None | 12.0 |
|  | D | 3.0 | 1.0 | 3.5 | 51 | 0.8 | 0.10 | 1.5 | 0.3 | Balance | L | 10.2 |
|  |  | 3.5 | 2.0 | 2.5 | 60 | 0.7 | 0.10 | 1.6 | 0.0 | Balance |  |  |
|  | E | 4.0 | 1.5 | 1.0 | 58 | 0.9 | 0.30 | 1.3 | 0.5 | Balance | S | 10.0 |
|  |  | 3.5 | 1.5 | 1.0 | 56 | 0.6 | 0.10 | 1.0 | 0.5 |  |  |  |
|  | F | 3.7 | 1.8 | 2.0 | 50 | 0.8 | 0.20 | 1.0 | 0.2 | Balance | None | 5.5 |
|  | I | 3.5 | 1.2 | 4.0 | 52 | 1.1 | 0.25 | 2.0 | 0.5 | Balance | None | 6.3 |
|  | J | 3.0 | 1.3 | 2.8 | 56 | 0.7 | 0.20 | 1.6 | 0.0 | Balance | L | 5.0 |
|  |  | 4.0 | 1.5 | 2.3 | 56 | 1.2 | 0.30 | 2.0 | 0.0 | Balance |  |  |
| Step for comparison | C' | 2.0 | 1.0 | 0.0 | 66 | 0.9 | 0.10 | 3.0 | 0.5 | Balance | None | 12.0 |
|  | D' | 8.0 | 1.0 | 6.5 | 50 | 0.8 | 0.10 | 3.0 | 0.0 | Balance | L | 10.2 |
|  |  | 1.0 | 1.0 | 3.4 | 66 | 0.7 | 0.10 | 2.0 | 0.0 | Balance |  |  |
|  | E' | 4.0 | 1.5 | 1.0 | 58 | 0.9 | 0.30 | 1.3 | 0.5 | Balance | S | 10.0 |
|  |  | 3.5 | 1.5 | 1.0 | 56 | 0.6 | 0.10 | 1.0 | 0.5 |  |  |  |
|  | F' | 3.2 | 1.5 | 2.5 | 50 | 0.8 | 0.20 | 1.0 | 0.2 | Balance | None | 5.5 |
|  | I' | 3.5 | 1.2 | 4.0 | 52 | 1.1 | 0.25 | 2.0 | 0.5 | Balance | None | 6.3 |
|  | J' | 3.0 | 1.3 | 2.8 | 56 | 0.7 | 0.20 | 1.6 | 0.0 | Balance | L | 5.0 |
|  |  | 4.0 | 1.5 | 2.3 | 56 | 1.2 | 0.30 | 2.0 | 0.0 | Balance |  |  |

TABLE 4-continued

| Formation of TiAlCN layer γ or δ | | Reaction condition of reaction gas γ or δ | | | | | |
|---|---|---|---|---|---|---|---|
| | | Gas group A | | Gas group B | | Phase difference between supply of gas group A and gas group B | Reaction atmosphere |
| Type of film formation step | Formation symbol | Supply time per cycle (Second) | Supply cycle (Second) | Supply time per cycle (Second) | Supply cycle (Second) | | Pressure (kPa) | Temperature (° C.) |
| Step of present invention | C | 0.40 | 12.0 | 0.40 | 0.18 | 4.5 | 850 |
| | D | 0.20 | 10.2 | 0.20 | 0.30 | 4.8 | 850 |
| | E | 0.70 | 10.0 | 0.70 | 0.55 | 4.9 | 850 |
| | F | 0.65 | 5.5 | 0.65 | 0.60 | 4.8 | 750 |
| | I | 0.50 | 6.3 | 0.50 | 0.60 | 5.0 | 800 |
| | J | 0.60 | 5.0 | 0.60 | 0.58 | 4.6 | 850 |
| Step for comparison | C' | 0.40 | 12.0 | 0.40 | 0.18 | 4.5 | 950 |
| | D' | 0.20 | 10.2 | 0.20 | 0.30 | 4.8 | 850 |
| | E' | 0.70 | 10.0 | 0.70 | 0.65 | 4.9 | 850 |
| | F' | 0.65 | 5.5 | 0.65 | 0.70 | 4.8 | 750 |
| | I' | 0.50 | 6.3 | 0.50 | 0.60 | 5.0 | 800 |
| | J' | 0.60 | 5.0 | 0.60 | 0.58 | 4.6 | 900 |

Note 1:
L shows that a change of a gas composition is a gradient change and S shows that a change of a gas composition is a stepwise change.

Note 2:
The gas composition in the upper row is a composition at the time of starting film formation and the gas composition in the lower row is a composition at the time of end of the film formation, when the change is the gradient change L Note 3:
The gas composition in the upper row is a composition at the first half of the film formation and the gas composition in the lower row is a composition at the second half of the film formation, when the change is the stepwise change S

TABLE 5

| Constituent layer of hard coating layer | | | Formation condition (Pressure represents kPa and temperature represents ° C. in reaction atmosphere) | | |
|---|---|---|---|---|---|
| Type | | Formation symbol | Reaction gas composition (% by volume) | Reaction atmosphere | |
| | | | | Pressure | Temperature |
| TiAlCN layer | TiAlCN | TiAlCN | See Tables 2 to 4 | See Tables 2 to 4 | |
| Ti compound layer | TiN | TiN | TiCl$_4$: 4.2%, N$_2$: 30.0%, H$_2$: Balance | 7.0 | 800 |
| | TiCN | TiCN | TiCl$_4$: 2.0%, CH$_3$CH: 0.7%, N$_2$: 10.0%, H$_2$: Balance | 7.0 | 800 |

TABLE 6

| | Tool body symbol | Hard coating layer (Numerical value in a represents an average layer thickness (μm) of the layer) Lower layer | |
|---|---|---|---|
| Type | | First layer | Second layer |
| Coated tool of present invention and Comparative coated tool | 1 A | — | — |
| | 2 B | — | — |
| | 3 C | — | — |
| | 4 A | TiN(0.1) | — |
| | 5 B | TiN(0.3) | TiCN(5.0) |
| | 6 C | TiN(0.5) | TiCN(3.0) |
| | 7 A | — | — |
| | 8 B | TiN(1.0) | TiCN(3.0) |
| | 9 C | TiN(0.5) | TiCN(2.0) |
| | 10 A | TiN(0.3) | TiCN(3.0) |

TABLE 7

| Type | | Formation symbol | TiAlCN layer α Composition (Atomic ratio) xα | TiAlCN layer α Composition (Atomic ratio) yα | TiAlCN layer α Average layer thickness Lα (μm) | TiAlCN layer α Area ratio of hexagonal crystal* (%) | TiAlCN layer β Composition (Atomic ratio) xβ | TiAlCN layer β Composition (Atomic ratio) yβ | TiAlCN layer β Average layer thickness Lβ (μm) | TiAlCN layer β Area ratio of cubic crystal* (%) | \|xα − xβ\| | TiAlCN layer γ Composition (Atomic ratio) xγ |
|---|---|---|---|---|---|---|---|---|---|---|---|---|
| Coated tool of present invention | 1 | A | 0.89 | 0.002 | 3.9 | 80 | 0.68 | 0.000 | 11.5 | 100 | 0.21 | — |
| | 2 | B | 0.92 | 0.000 | 0.5 | 88 | 0.83 | 0.010 | 1.0 | 95 | 0.09 | — |
| | 3 | C | 0.70 | 0.005 | 2.3 | 70 | 0.95 | 0.002 | 12.0 | 70 | 0.25 | 0.89 |
| | 4 | D | 0.85 | 0.008 | 2.4 | 95 | 0.90 | 0.000 | 7.8 | 75 | 0.05 | — |
| | 5 | E | 0.95 | 0.000 | 5.3 | 100 | 0.65 | 0.005 | 6.0 | 100 | 0.30 | — |
| | 6 | F | 0.73 | 0.010 | 2.7 | 75 | 0.83 | 0.004 | 4.2 | 98 | 0.10 | 0.79 |
| | 7 | G | 0.93 | 0.000 | 4.0 | 77 | 0.70 | 0.000 | 3.5 | 88 | 0.23 | — |
| | 8 | H | 0.90 | 0.007 | 2.0 | 86 | 0.90 | 0.000 | 10.1 | 77 | 0.00 | — |
| | 9 | I | 0.79 | 0.000 | 1.0 | 92 | 0.83 | 0.001 | 6.3 | 95 | 0.04 | 0.81 |
| | 10 | J | 0.84 | 0.000 | 3.0 | 91 | 0.75 | 0.005 | 2.8 | 98 | 0.09 | — |
| Comparative coated tool | 1 | A' | 0.97 | 0.002 | 7.0 | 98 | 0.86 | 0.000 | 3.0 | 0 | 0.09 | — |
| | 2 | B' | 0.53 | 0.000 | 3.4 | 0 | 0.43 | 0.000 | 4.0 | 100 | 0.10 | — |
| | 3 | C' | 0.73 | 0.040 | 8.3 | 10 | 0.88 | 0.050 | 5.0 | 71 | 0.15 | 0.91 |
| | 4 | D' | 0.51 | 0.000 | 6.1 | 85 | 0.91 | 0.000 | 2.0 | 35 | 0.40 | — |
| | 5 | E' | 1.00 | 0.000 | 4.0 | 100 | 0.63 | 0.005 | 4.0 | 100 | 0.37 | — |
| | 6 | F' | 0.72 | 0.009 | 3.4 | 3 | 0.00 | 0.000 | 5.3 | 100 | 0.73 | 0.78 |
| | 7 | G' | 0.75 | 0.000 | 2.0 | 11 | 0.70 | 0.000 | 5.0 | 83 | 0.05 | — |
| | 8 | H' | 0.48 | 0.008 | 3.6 | 5 | 0.51 | 0.000 | 12.0 | 100 | 0.03 | — |
| | 9 | I' | 0.98 | 0.000 | 11.0 | 95 | 0.83 | 0.001 | 2.5 | 26 | 0.15 | 0.81 |
| | 10 | J' | 0.83 | 0.000 | 4.1 | 0 | 0.75 | 0.005 | 0.5 | 98 | 0.08 | — |

| Type | | TiAlCN layer γ Composition (Atomic ratio) yγ | TiAlCN layer γ Average layer thickness Lγ (μm) | Validation of Inequation 1 | TiAlCN layer δ Composition (Atomic ratio) xδL | TiAlCN layer δ Composition (Atomic ratio) yδL | TiAlCN layer δ Composition (Atomic ratio) xδH | TiAlCN layer δ Composition (Atomic ratio) yδH | TiAlCN layer δ Average layer thickness Lδ (μm) | Validation of Inequation 2 | Only flank face* |
|---|---|---|---|---|---|---|---|---|---|---|---|
| Coated tool of present invention | 1 | — | — | — | — | — | — | — | — | — | / |
| | 2 | — | — | — | — | — | — | — | — | — | / |
| | 3 | 0.000 | 0.1 | ○ | — | — | — | — | — | — | / |
| | 4 | — | — | — | 0.89 | 0.006 | 0.87 | 0.000 | 0.1 | ○ | / |
| | 5 | — | — | — | 0.75 | 0.010 | 0.84 | 0.010 | 1.0 | ○ | / |
| | 6 | 0.005 | 0.5 | ○ | — | — | — | — | — | — | / |
| | 7 | — | — | — | — | — | — | — | — | — | ○ |
| | 8 | — | — | — | — | — | — | — | — | — | ○ |
| | 9 | 0.010 | 1.0 | ○ | — | — | — | — | — | — | ○ |
| | 10 | — | — | — | 0.78 | 0.000 | 0.81 | 0.000 | 0.5 | ○ | ○ |
| Comparative coated tool | 1 | — | — | — | — | — | — | — | — | — | / |
| | 2 | — | — | — | — | — | — | — | — | — | / |
| | 3 | 0.010 | 3.0 | x | — | — | — | — | — | — | / |
| | 4 | — | — | — | 0.89 | 0.000 | 0.87 | 0.000 | 2.0 | ○ | / |
| | 5 | — | — | — | 0.74 | 0.010 | 0.83 | 0.010 | 0.8 | ○ | / |
| | 6 | 0.005 | 1.0 | x | — | — | — | — | — | — | / |
| | 7 | — | — | — | — | — | — | — | — | — | ○ |
| | 8 | — | — | — | — | — | — | — | — | — | ○ |
| | 9 | 0.010 | 0.5 | x | — | — | — | — | — | — | ○ |
| | 10 | — | — | — | 0.76 | 0.000 | 0.83 | 0.000 | 1.5 | ○ | ○ |

Note 1:
"—" represents an absent state or represents that there is no need to examine.
Note 2:
An area ratio of *hexagonal crystal represents an area ratio (%) of crystal grains having a wurtzite type hexagonal structure.
Note 3:
An area ratio of *cubic crystal represents an area ratio (%) of crystal grains having a NaCl type face-centered cubic structure.
Note 4:
Regarding validation of Inequation 1, when xα < xγ < xβ or xα > xγ > xβ is validated, ○ is denoted, and when xα < xγ < xβ or xα > xγ > xβ is not validated, x is denoted.
Note 5:
Regarding validation of Inequation 2, when xα ≤ xδH ≤ xδL ≤ xβ is validated, ○ is denoted, and when xα ≤ xδH ≤ xδL ≤ xβ is not validated, x is denoted.
Note 6:
Regarding only the flank face, when only the TiAlCN layer β is provided on the surface of the flank face, ○ is denoted, and otherwise, / is denoted.

Next, the coated tools 1 to 10 of the present invention and comparative coated tools 1 to 10 were subjected to the following cutting test.

In a state where the various coated tools were clamped to the tip of an alloy steel cutter with a cutter diameter of 85 mm with a fixing jig, the following wet high-speed face milling and center cut cutting test for cast iron were performed and the width of flank wear of a cutting edge was measured. Table 8 shows the results of the cutting test. Since the comparative coated tools 1 to 10 have reached the end of the life due to the occurrence of chipping, the time until the end of the life is shown.

Cutting test: Wet high-speed face milling and center cut cutting test

Cutter diameter: 85 mm

Work material: JIS/FCD700 Block material with a width of 60 mm and a length of 400 mm Rotation speed: 1124 $min^{-1}$ Cutting speed: 300 m/min Depth of cut: 3.0 mm Feed rate: 0.3 mm/tooth Cutting time: 5 minutes (Normal cutting speed is 200 m/min)

TABLE 8

| Type | | width of flank wear (mm) | Type | | *: Cutting time until end of life (Minute) |
|---|---|---|---|---|---|
| Coated tool of present invention | 1 | 0.19 | Comparative coated tool | 1 | 3.8 |
| | 2 | 0.18 | | 2 | 3.0 |
| | 3 | 0.17 | | 3 | 4.3 |
| | 4 | 0.15 | | 4 | 4.3 |
| | 5 | 0.16 | | 5 | 4.2 |
| | 6 | 0.12 | | 6 | 2.8 |
| | 7 | 0.18 | | 7 | 3.2 |
| | 8 | 0.17 | | 8 | 3.0 |
| | 9 | 0.11 | | 9 | 4.6 |
| | 10 | 0.10 | | 10 | 4.8 |

The cutting time (minute) until the end of the life of the comparative coated tool represents the cutting time until the end of the life due to the occurrence of chipping.

Example 2

As raw material powders, a WC powder, a TiC powder, a ZrC powder, a TaC powder, a NbC powder, a $Cr_3C_2$ powder, a TiN powder, and a Co powder all having an average particle size of 1 to 3 μm were prepared. These raw material powders were blended to have a blending composition shown in Table 9, and a wax was further added and subjected to ball-mill mixing in acetone for 24 hours. The mixture was dried under a reduced pressure. Thereafter, the mixture was press-molded into a green compact having a predetermined shape at a pressure of 98 MPa, and the green compact was vacuum-sintered in a vacuum of 5 Pa under conditions at a predetermined temperature in a range of 1370 to 1470° C. for a holding time of 1 hour. After the sintering, tool bodies α to γ made of the WC-based cemented carbide having an insert shape of ISO standard CNMG 120412 were produced by subjecting to a honing of R: 0.07 mm to the cutting edge.

Next, the TiAlCN layer α, the TiAlCN layer β, the TiAlCN layer γ, and the TiAlCN layer δ were formed on the surfaces of these tool body α to γ, by using a CVD apparatus under the conditions shown in Tables 2 to 4 in the same method as in Example 1 to obtain coated tools 11 to 20 of the present invention shown in Table 11.

The coated tools 14 to 16, 18, and 19 of the present invention were formed to have the lower layer shown in Table 10 under the film forming conditions shown in Table 5.

Also, as in the Example 1, for the objective of comparison, comparative coated tools 11 to 20 shown in Table 11 were produced by using the CVD method on the surfaces of the tool bodies α to γ under the conditions shown in Tables 2 to 4.

The comparative coated tools 14 to 16, 18, and 19 were formed to have the lower layer shown in Table 10 under the forming conditions shown in Table 5.

Also, as in Example 1, for the hard coating layers of the coated tools 11 to 20 of the present invention and the comparative coated tools 11 to 20, the composition of each TiAlCN layer, the average layer thickness, the area ratio of the crystal grains of the wurtzite type hexagonal structure, and the area ratio of the crystal grains having the NaCl type face-centered cubic structure were determined using the above method. The results thereof are shown in Table 11.

TABLE 9

| | | Blending composition (% by mass) | | | | | | |
|---|---|---|---|---|---|---|---|---|
| Type | | Co | TiC | ZrC | TaC | NbC | $Cr_3C_2$ | TiN | WC |
| Tool body | α | 6.5 | — | 1.5 | — | 2.5 | 0.1 | 1.5 | Balance |
| | β | 7.5 | 2.4 | — | 4.0 | 0.5 | — | 1.0 | Balance |
| | γ | 6.0 | — | — | — | — | — | — | Balance |

TABLE 10

| | | Hard coating layer (Numerical value in a lower row represents an average layer thickness (μm) of the layer) | |
|---|---|---|---|
| | Tool body | Lower layer | |
| Type | symbol | First layer | Second layer |
| Coated tool of present invention and Comparative coated tool | 11 α | — | — |
| | 12 β | — | — |
| | 13 γ | — | — |
| | 14 α | TiN (2.0) | — |
| | 15 β | TiN (0.5) | TiCN (5.0) |
| | 16 γ | TiN (1.0) | TiCN (7.0) |
| | 17 α | — | — |
| | 18 β | TiN (1.0) | TiCN (7.0) |
| | 19 γ | TiN (0.5) | TiCN (20.0) |
| | 20 α | — | — |

TABLE 11

| Type | | Formation symbol | TiAlCN layer α Composition (Atomic ratio) xα | TiAlCN layer α Composition (Atomic ratio) yα | TiAlCN layer α Average layer thickness Lα (μm) | TiAlCN layer α Area ratio of hexagonal crystal* (%) | TiAlCN layer β Composition (Atomic ratio) xβ | TiAlCN layer β Composition (Atomic ratio) yβ | TiAlCN layer β Average layer thickness Lβ (μm) | TiAlCN layer β Area ratio of cubic crystal* (%) | \|xα − xβ\| | TiAlCN layer γ Composition (Atomic ratio) xγ |
|---|---|---|---|---|---|---|---|---|---|---|---|---|
| Coated tool of present invention | 11 | A | 0.89 | 0.002 | 5.3 | 78 | 0.68 | 0.000 | 11.5 | 100 | 0.21 | — |
| | 12 | B | 0.91 | 0.000 | 1.0 | 90 | 0.83 | 0.010 | 20.0 | 96 | 0.08 | — |
| | 13 | C | 0.70 | 0.005 | 7.3 | 70 | 0.95 | 0.002 | 12.0 | 73 | 0.25 | 0.89 |
| | 14 | D | 0.85 | 0.008 | 10.0 | 94 | 0.90 | 0.000 | 4.5 | 75 | 0.05 | — |
| | 15 | E | 0.95 | 0.000 | 5.0 | 100 | 0.65 | 0.005 | 5.3 | 100 | 0.30 | — |
| | 16 | F | 0.73 | 0.010 | 6.5 | 70 | 0.83 | 0.004 | 11.5 | 100 | 0.10 | 0.78 |
| | 17 | G | 0.92 | 0.000 | 7.0 | 73 | 0.70 | 0.000 | 12.9 | 89 | 0.22 | — |
| | 18 | H | 0.91 | 0.007 | 7.3 | 88 | 0.90 | 0.000 | 10.1 | 80 | 0.01 | — |
| | 19 | I | 0.80 | 0.000 | 8.2 | 93 | 0.83 | 0.001 | 14.0 | 95 | 0.03 | 0.82 |
| | 20 | J | 0.83 | 0.000 | 7.2 | 92 | 0.75 | 0.005 | 4.0 | 100 | 0.08 | — |
| Comparative coated tool | 11 | A' | 0.98 | 0.002 | 4.2 | 100 | 0.86 | 0.000 | 25.0 | 0 | 0.12 | — |
| | 12 | B' | 0.52 | 0.000 | 15.0 | 0 | 0.43 | 0.000 | 22.0 | 100 | 0.09 | — |
| | 13 | C' | 0.73 | 0.040 | 1.0 | 9 | 0.88 | 0.050 | 15.4 | 68 | 0.15 | 0.90 |
| | 14 | D' | 0.49 | 0.000 | 6.5 | 5 | 0.91 | 0.000 | 16.3 | 40 | 0.42 | — |
| | 15 | E' | 1.00 | 0.000 | 7.8 | 100 | 0.63 | 0.005 | 8.3 | 100 | 0.37 | — |
| | 16 | F' | 0.73 | 0.009 | 4.9 | 2 | 0.00 | 0.000 | 2.5 | 100 | 0.73 | 0.79 |
| | 17 | G' | 0.77 | 0.000 | 11.0 | 11 | 0.70 | 0.000 | 9.8 | 84 | 0.07 | — |
| | 18 | H' | 0.47 | 0.008 | 5.5 | 7 | 0.51 | 0.000 | 3.3 | 100 | 0.04 | — |
| | 19 | I' | 0.97 | 0.000 | 3.2 | 95 | 0.83 | 0.001 | 8.5 | 25 | 0.14 | 0.80 |
| | 20 | J' | 0.82 | 0.000 | 3.3 | 1 | 0.75 | 0.005 | 1.0 | 95 | 0.07 | — |

| Type | | TiAlCN layer γ Composition (Atomic ratio) yγ | TiAlCN layer γ Average layer thickness Lγ (μm) | Validation of Inequation 1 | TiAlCN layer δ Composition (Atomic ratio) xδL | TiAlCN layer δ Composition (Atomic ratio) yδL | TiAlCN layer δ Composition (Atomic ratio) xδH | TiAlCN layer δ Composition (Atomic ratio) yδH | Average layer thickness Lδ (μm) | Validation of Inequation 2 | Only flank face* |
|---|---|---|---|---|---|---|---|---|---|---|---|
| Coated tool of present invention | 11 | — | — | — | — | — | — | — | — | — | / |
| | 12 | — | — | — | — | — | — | — | — | — | / |
| | 13 | 0.000 | 0.4 | ○ | — | — | — | — | — | — | / |
| | 14 | — | — | — | 0.89 | 0.006 | 0.88 | 0.000 | 0.3 | ○ | / |
| | 15 | — | — | — | 0.76 | 0.010 | 0.84 | 0.010 | 0.8 | ○ | / |
| | 16 | 0.005 | 0.5 | ○ | — | — | — | — | — | — | / |
| | 17 | — | — | — | — | — | — | — | — | — | ○ |
| | 18 | — | — | — | — | — | — | — | — | — | ○ |
| | 19 | 0.010 | 1.0 | ○ | — | — | — | — | — | — | ○ |
| | 20 | — | — | — | 0.79 | 0.000 | 0.81 | 0.000 | 1.0 | ○ | ○ |
| Comparative coated tool | 11 | — | — | — | — | — | — | — | — | — | / |
| | 12 | — | — | — | — | — | — | — | — | — | / |
| | 13 | 0.010 | 2.0 | x | — | — | — | — | — | — | / |
| | 14 | — | — | — | 0.88 | 0.000 | 0.87 | 0.000 | 2.0 | ○ | / |
| | 15 | — | — | — | 0.74 | 0.010 | 0.81 | 0.010 | 0.5 | ○ | / |
| | 16 | 0.005 | 1.6 | x | — | — | — | — | — | — | / |
| | 17 | — | — | — | — | — | — | — | — | — | ○ |
| | 18 | — | — | — | — | — | — | — | — | — | ○ |
| | 19 | 0.010 | 0.8 | x | — | — | — | — | — | — | ○ |
| | 20 | — | — | — | 0.77 | 0.000 | 0.82 | 0.000 | 3.0 | ○ | ○ |

Note 1:
"—" represents an absent state or represents that there is no need to examine.

Note 2:
An area ratio of *hexagonal crystal represents an area ratio (%) of crystal grains having a wurtzite type hexagonal structure.

Note 3:
An area ratio of *cubic crystal represents an area ratio (%) of crystal grains having a NaCl type face-centered cubic structure.

Note 4:
Regarding validation of Inequation 1, when $x\alpha < x\gamma < x\beta$ or $x\alpha > x\gamma > x\beta$ is validated, ○ is denoted, and when $x\alpha < x\gamma < x\beta$ or $x\alpha > x\gamma > x\beta$ is not validated, x is denoted.

Note 5:
Regarding validation of Inequation 2, when $x\alpha \leq x\delta H < x\delta L \leq x\beta$ is validated, ○ is denoted, and when $x\alpha \leq x\delta H < x\delta L \leq x\beta$ is not validated, x is denoted.

Note 6:
Regarding only the flank face, when only the TiAlCN layer β is provided on the surface of the flank face, ○ is denoted, and otherwise, / is denoted.

Next, In a state where the various coated tools were screwed to the tip of the alloy steel cutting tool with a fixing jig, the coated tools 11 to 20 of the present invention and the comparative coated tools 11 to 20 were subjected to dry high-speed intermittent cutting test shown below, and the width of flank wear of the cutting edge was measured. The results thereof are shown in Table 12. Since the comparative coated tools 11 to 20 have reached the end of the life due to the occurrence of chipping, the time until the end of the life is shown.

Cutting test: Dry high-speed intermittent cutting
Work material: JIS/FCD600 Round bar with 8 vertical grooves at equal intervals in a length direction
Cutting speed: 350 m/min
Depth of cut: 3.0 mm
Feed: 0.3 mm/rev
Cutting time: 5 minutes
(Normal cutting speed is 200 m/min)

TABLE 12

| Type | | width of flank wear (mm) | Type | | *: Cutting time until end of life (Minute) |
|---|---|---|---|---|---|
| Coated | 11 | 0.18 | Comparative | 11 | 3.8 |
| tool of | 12 | 0.17 | coated | 12 | 2.7 |
| present | 13 | 0.17 | tool | 13 | 4.2 |
| invention | 14 | 0.14 | | 14 | 4.1 |
| | 15 | 0.15 | | 15 | 4.0 |
| | 16 | 0.11 | | 16 | 2.3 |
| | 17 | 0.18 | | 17 | 3.2 |
| | 18 | 0.16 | | 18 | 3.0 |
| | 19 | 0.11 | | 19 | 4.4 |
| | 20 | 0.09 | | 20 | 4.5 |

The cutting time (minute) until the end of the life of the comparative coated tool represents the cutting time until the end of the life due to the occurrence of chipping.

From the results shown in Tables 8 and 12, the hard coating layer of each of the coated tool 1 to 20 of the present invention has excellent chipping resistance. Therefore, even when used for high-speed intermittent cutting of cast iron or the like, chipping does not occur and excellent wear resistance is exhibited over a long period of time. On the other hand, in the comparative coated tools 1 to 20 which do not satisfy even one of the matters specified in the coated tool of the present invention, chipping occurs when used for the high-speed intermittent cutting of cast iron or the like, and the tool life has reached the end in a short time.

INDUSTRIAL APPLICABILITY

As described above, the coated tool of the present invention can be used as a coated tool for high-speed intermittent cutting of cast iron or the like, and also exhibits excellent wear resistance for a long period of time. Therefore, it is possible to fully satisfy the labor saving and energy saving of the cutting and the cost reduction.

REFERENCE SIGNS LIST

1: TiAlCN layer α
2: TiAlCN layer β
3: Tool body
4: TiAlCN layer γ or TiAlCN layer δ
5: Rake face
6: Flank face
S: Tool surface side
B: Tool body side

What is claimed is:
1. A surface-coated cutting tool comprising:
a tool body; and
a hard coating layer provided on a surface of the tool body, wherein
(a) the hard coating layer has a laminated structure having: (i) one TiAlCN layer α containing 70 area % or more of crystal grains having a wurtzite type hexagonal structure of a complex nitride or a complex carbonitride of Ti and Al, the one TiAlCN layer α forming the outermost surface of the cutting tool; and (ii) one TiAlCN layer β containing 70 area % or more of crystal grains having a NaCl type face-centered cubic structure of a complex nitride or complex carbonitride of Ti and Al, the one TiAlCN layer β being provided above the tool body and below the one TiAlCN layer α,
(b) when a composition of the TiAlCN layer α is represented by Composition Formula: $(Ti_{(1-x\alpha)}Al_{x\alpha})(C_{y\alpha}N_{(1-y\alpha)})$, an average content ratio xα of Al in a total amount of Ti and Al and an average content ratio yα of C in a total amount of C and N (here, xα and yα are atomic ratios) satisfy $0.70 \leq x\alpha \leq 0.95$ and $0.000 \leq y\alpha \leq 0.010$,
(c) when a composition of the TiAlCN layer β is represented by Composition Formula: $(Ti_{(1-x\beta)}Al_{x\beta})(C_{y\beta}N_{(1-y\beta)})$, an average content ratio xβ of Al in a total amount of Ti and Al and an average content ratio yβ of C in a total amount of C and N (here, xβ and yβ are atomic ratios) satisfy $0.65 \leq x\beta \leq 0.95$ and $0.000 \leq y\beta \leq 0.010$, and
(d) when average layer thicknesses of the TiAlCN layer α and the TiAlCN layer β are defined as Lα and Lβ, the TiAlCN layer α and the TiAlCN layer β satisfy $0.5 \mu m \leq L\alpha \leq 10.0 \mu m$ and $1.0 \mu m \leq L\beta \leq 20.0 \mu m$.

2. The surface-coated cutting tool according to claim 1, wherein a difference between the xα and the xβ satisfies $|x\alpha - x\beta| \leq 0.20$.

3. The surface-coated cutting tool according to claim 1, wherein
a TiAlCN layer γ containing at least crystal grains having a NaCl type face-centered cubic structure of a complex nitride or a complex carbonitride of Ti and Al, exists between the TiAlCN layer α and the TiAlCN layer β,
(a) when a composition of the TiAlCN layer γ is represented by Composition Formula: $(Ti_{(1-x\gamma)}Al_{x\gamma})(C_{y\gamma}N_{(1-y\gamma)})$, xγ satisfies $x\alpha \leq x\gamma \leq x\beta$ or $x\alpha \geq x\gamma \geq x\beta$ and yγ satisfies $0.000 \leq y\gamma \leq 0.010$, regarding an average content ratio xγ of Al in a total amount of Ti and Al and an average content ratio yγ of C in a total amount of C and N (here, xγ and yγ are atomic ratios), and
(b) when an average layer thickness of the TiAlCN layer γ is defined as Lγ, $0.1 \mu m \leq L\gamma \leq 1.0 \mu m$ is satisfied.

4. The surface-coated cutting tool according to claim 1, wherein
when the xα and the xβ satisfy $x\alpha \neq x\beta$, a TiAlCN layer δ containing at least crystal grains having a NaCl type face-centered cubic structure of a complex nitride or a complex carbonitride of Ti and Al, exists between the TiAlCN layer α and the TiAlCN layer β,
(a) in the TiAlCN layer δ, an average content ratio xδL of Al in a total amount of Ti and Al and an average content ratio yδL of C in a total amount of C and N (here, xδL and yδL are atomic ratios) when a composition of a region on the tool body side of the TiAlCN layer δ divided into two equal parts in a layer thickness direction of the TiAlCN layer δ is represented by Composition Formula: $(Ti_{(1-x\delta L)}Al_{x\delta L})(C_{y\delta L}N_{(1-y\delta L)})$ and an average content ratio xδH of Al in a total amount of Ti and Al and an average content ratio yδH of C in a total amount of C and N (here, xδH and yδH are atomic ratios) when a composition of a region on the tool surface side of the TiAlCN layer δ divided into two equal parts in the layer thickness direction of the TiAlCN layer δ is represented by Composition Formula: $(Ti_{(1-x\delta H)}Al_{x\delta H})(C_{y\delta H}N_{(1-y\delta H)})$ satisfy $x\alpha \leq x\delta H \leq x\delta L \leq x\beta$ or $x\beta \leq x\delta L < x\delta H \leq x\alpha$ and $0.000 \leq y\delta H \leq 0.010$ and $0.000 \leq y\delta L \leq 0.010$, and (b) when an average layer thickness of the TiAlCN layer δ is defined as Lδ, the TiAlCN layer δ satisfies $0.1 \mu m \leq L\delta \leq 1.0 \mu m$.

5. The surface-coated cutting tool according to claim 1, wherein the hard coating layer having the laminated structure of the TiAlCN layer α and the TiAlCN layer β is provided on the rake face of the surface-coated cutting tool, and the TiAlCN layer β is provided on a surface of a flank face.

* * * * *